(12) United States Patent
Li et al.

(10) Patent No.: US 8,050,077 B2
(45) Date of Patent: Nov. 1, 2011

(54) SEMICONDUCTOR DEVICE WITH TRANSISTOR-BASED FUSES AND RELATED PROGRAMMING METHOD

(75) Inventors: Ruigang Li, Austin, TX (US); David Donggang Wu, Austin, TX (US); James F. Buller, Austin, TX (US); Jingrong Zhou, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 199 days.

(21) Appl. No.: 12/392,645

(22) Filed: Feb. 25, 2009

(65) Prior Publication Data
US 2010/0214008 A1    Aug. 26, 2010

(51) Int. Cl.
G11C 17/18    (2006.01)
G11C 17/16    (2006.01)
G11C 17/14    (2006.01)
G11C 17/08    (2006.01)
G11C 17/00    (2006.01)

(52) U.S. Cl. ........ 365/104; 365/96; 365/225.7; 327/525
(58) Field of Classification Search .................... 365/96, 365/104, 225.7; 327/525; 257/529
See application file for complete search history.

(56) References Cited

U.S. PATENT DOCUMENTS 5,672,994 A * 9/1997 Au et al. .................... 327/525
7,529,148 B2 * 5/2009 Shah et al. ................. 365/225.7

* cited by examiner

Primary Examiner — J. H. Hur
(74) Attorney, Agent, or Firm — Ingrassia Fisher & Lorenz, P.C.

(57) ABSTRACT

A transistor-based fuse structure is realized in a semiconductor device having a semiconductor substrate, transistor devices formed on the semiconductor substrate, and the transistor-based fuse structure formed on the semiconductor substrate. The transistor-based fuse structure includes a plurality of transistor-based fuses, and the method begins by selecting, from the plurality of transistor-based fuses, a first target fuse to be programmed for operation in a low-resistance/high-current state, the first target fuse having a first source, a first gate, a first drain, and a first gate insulator layer between the first gate and the semiconductor substrate. The method applies a first set of program voltages to the first source, the first gate, and the first drain to cause breakdown of the first gate insulator layer such that current can flow from the first source to the first gate through the first gate insulator layer, and from the first gate to the first drain through the first gate insulator layer.

8 Claims, 4 Drawing Sheets

SEMICONDUCTOR DEVICE WITH TRANSISTOR-BASED FUSES AND RELATED PROGRAMMING METHOD

TECHNICAL FIELD

Embodiments of the subject matter described herein relate generally to semiconductor devices. More particularly, embodiments of the subject matter relate to a transistor-based fuse structure and methods for programming the states of the fuses.

BACKGROUND

The prior art is replete with semiconductor devices and circuits that have selectable, switchable, and/or configurable operating states, features, devices, or elements. In many implementations, different components or circuit elements can be inserted or removed as necessary using one-time programmable (OTP) fuses. For example, OTP fuses are typically used to implement cache redundancy in SRAM devices. Such OTP fuses can be used to remove a bad column or row of memory cells and to replace the bad memory cells with a redundant column or row.

In accordance with one known technique, OTP fuses for semiconductor devices are fabricated using silicided polysilicon. These prior art OTP fuses require relatively high voltages during programming, and the high voltage programming procedure generates excess heat that can potentially damage surrounding circuit elements or components. These prior art OTP fuses may also require high programming voltages that are not otherwise available on the semiconductor device. In other words, a different supply voltage devoted to fuse programming may need to be implemented to support such OTP fuses. Moreover, these prior art OTP fuses require additional (or customized) semiconductor fabrication processes above and beyond that required to manufacture the operating devices, transistors, and circuits of the host semiconductor device itself.

BRIEF SUMMARY

A semiconductor device in accordance with one embodiment includes a semiconductor substrate, at least one transistor-based device that is formed on the semiconductor substrate using a semiconductor fabrication process, and a transistor-based fuse structure that is concurrently formed on the semiconductor substrate using the semiconductor fabrication process.

A method of programming a transistor-based fuse structure on a semiconductor device is also provided. The semiconductor device has a semiconductor substrate, transistor devices formed on the semiconductor substrate, and the transistor-based fuse structure formed on the semiconductor substrate. The transistor-based fuse structure includes a plurality of transistor-based fuses. The method begins by selecting, from the plurality of transistor-based fuses, a first target fuse to be programmed for operation in a low-resistance/high-current state, the first target fuse having a first source, a first gate, a first drain, and a first gate insulator layer between the first gate and the semiconductor substrate. The method also applies a first set of program voltages to the first source, the first gate, and the first drain to cause breakdown of the first gate insulator layer such that current can flow from the first source to the first gate through the first gate insulator layer, and from the first gate to the first drain through the first gate insulator layer.

A method of programming an array of transistor-based fuses is also provided. The method is performed for a semiconductor device having a common semiconductor substrate, transistor devices formed on the common semiconductor substrate and adapted for operation with a supply voltage, and the array of transistor-based fuses formed on the common semiconductor substrate. Each of the transistor-based fuses includes a respective source, drain, gate, and gate insulator layer between the gate and the common semiconductor substrate. The method applies the same relatively low voltage to the source of each transistor-based fuse in the array, applies the same relatively high programming voltage to the drain of each transistor-based fuse in the array, selects a first subset of transistor-based fuses from the array to be programmed for operation in a low-resistance/high-current state, and selects a second subset of transistor-based fuses from the array to be programmed for operation in a high-resistance/low-current state. The method also floats the gate of each transistor-based fuse in the first subset to cause breakdown of the respective gate insulator layers, and grounds the gate of each transistor-based fuse in the second subset to preserve the respective gate insulator layers.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. In particular, various steps in the manufacture of semiconductor based transistors are well known and so, in the interest of brevity, many conventional steps will only be mentioned briefly herein or will be omitted entirely without providing the well known process details. Moreover, the various tasks and process steps described herein may be incorporated into a more comprehensive procedure or process having additional steps or functionality not described in detail herein.

Figure 1:
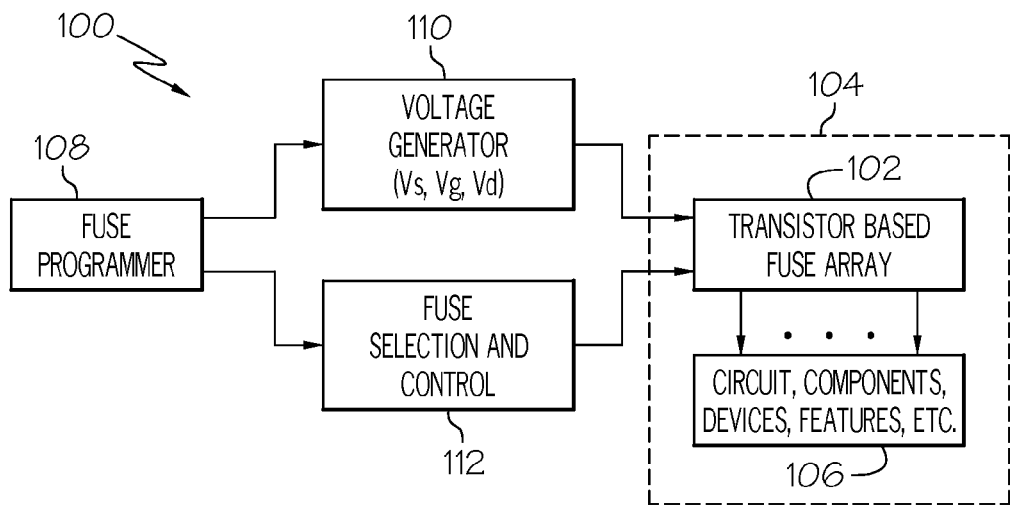
FIG. 1 is a schematic block diagram representation of a semiconductor device that includes a transistor-based fuse array.

FIG. 1 is a schematic block diagram representation of a semiconductor device 100 that includes a transistor-based fuse array 102 formed on a semiconductor substrate 104. Notably, at least one other circuit, device, component, or feature 106 is also formed on semiconductor substrate 104. In preferred embodiments, for example, at least one transistor-based device (e.g., one or more NFET devices and/or one or more PFET devices) are formed on semiconductor substrate 104. Notably, the transistor-based fuses in array 102 and the transistor-based devices (represented by reference number 106) are fabricated using the same semiconductor fabrication techniques and process technology. In other words, the same transistor technology and manufacturing technique is utilized to create the transistor-based fuses and the operating transistors of semiconductor device 100. Moreover, the transistor-based fuses and operating transistors can be concurrently fabricated during the same manufacturing process. Thus, array 102 can be efficiently formed by leveraging the same fabrication process used for the other transistor-based devices 106.

Semiconductor substrate 104 has a layer of semiconductor material that is used to form transistor devices and transistor-based fuses. Semiconductor substrate 104 may be a silicon-on-insulator (SOI) substrate or a bulk silicon substrate, although other semiconductor materials could be used. The semiconductor material can originally be either N-type or P-type silicon, but is typically P-type, and the semiconductor material is subsequently doped in an appropriate manner to form active regions.

Semiconductor device 100 may also include a fuse programmer 108, a voltage generator 110, and a fuse selection and control element 112. Although not depicted as such in FIG. 1, these components may also be formed on semiconductor substrate 104. Fuse programmer 108 is suitably configured to program the transistor-based fuses in array 102 to operate in either a high-resistance/low-current state or a low-resistance/high-current state. In this regard, fuse programmer 108 may include or cooperate with voltage generator 110 and/or with fuse selection and control element 112 in the manner described in more detail below. It should be appreciated that FIG. 1 depicts an overly simplified representation of an exemplary embodiment, and that an actual deployment may include conventional elements, logic, components, and functionality not shown in FIG. 1.

Although not individually shown in FIG. 1, array 102 preferably includes a plurality of programmable transistor-based fuses. In practice, the transistor-based fuses are OTP fuses, i.e., they are only programmed one time. Accordingly, fuse programmer 108 and fuse selection and control element 112 are suitably configured to facilitate the selection of transistor-based fuses in array 102 for programming. In practical embodiments, the system may leverage known addressing and switching techniques to select a desired target fuse (or a plurality of target fuses) in array 102 for programming into one of two states: a low-resistance/high-current state; or a high-resistance/low-current state.

Fuse programmer 108 may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, a processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration. Moreover, the steps of a method or algorithm described in connection with the embodiments disclosed herein may be realized directly in hardware, in firmware, in a software module executed by a processor, or in any practical combination thereof. A software module may reside in RAM memory, flash memory, ROM memory, EPROM memory, EEPROM memory, registers, a hard disk, a removable disk, a CD-ROM, or any other form of storage medium known in the art.

Semiconductor device 100 may include or cooperate with voltage generator 110, which is coupled to array 102. Voltage generator 110 can be controlled by fuse programmer 108. Voltage generator 110 is suitably configured to generate the necessary voltages utilized in connection with programming the transistor-based fuses in array 102. For example, voltage generator 110 may include or utilize one or more charge pumps, one or more voltage divider circuits, and/or one or more distinct voltage sources. Voltage generator 110 may be designed to provide any number of fixed, variable, and/or dynamically adjustable voltage signals (including ground potential). In addition, voltage generator 110 may be designed to leave a node or terminal of array 102 in a floating state, i.e., no voltage asserted. The manner in which fuse programmer 108, voltage generator 110, and fuse selection and control element 112 cooperate to program array 102 is described in more detail below.

Figure 2:
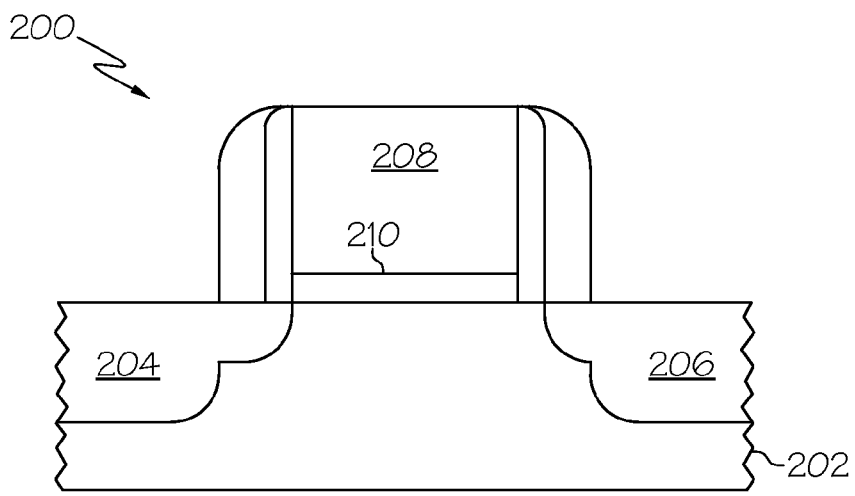
FIG. 2 is a cross sectional view of a transistor-based fuse.

As mentioned previously, array 102 may include a plurality of transistor-based fuses formed on a common semiconductor substrate. In this regard, FIG. 2 is a cross sectional view of a transistor-based fuse 200 that is suitable for use in array 102, which may contain any number of such fuses 200. Preferred embodiments utilize NFET (e.g., NMOS) transistor structures for the transistor-based fuses, because NFETs are easier to program than PFETs. That said, PFETs could be employed in an equivalent manner, and the techniques and technologies described here for NFET fuses can be extended for PFET applications.

Fuse 200 generally includes semiconductor material 202, a source region 204 in semiconductor material 202, a drain region 206 in semiconductor material 202, a gate 208 overlying semiconductor material 202, and a gate insulator layer 210 located between gate 208 and semiconductor material 202. Gate insulator layer 210 is formed from a dielectric material such as silicon oxide. The general and overall structure of fuse 200 may be identical to that utilized for other transistor devices located on the same semiconductor substrate. In preferred embodiments, fuse 200 and at least one other transistor-based device are concurrently formed on a common semiconductor substrate using the same semiconductor fabrication process. Accordingly, fuse 200 is preferably fabricated using well known semiconductor fabrication steps, processes, and technologies. For example, fabrication of fuse 200 may involve conventional photolithography, etching, cleaning, material deposition, material growth, ion implantation, and polishing steps. Such well known manufacturing process steps will not be described in detail here.

For a given transistor-based fuse, fuse programmer 108 and voltage generator 110 (see FIG. 1) establish one set of program voltages at the source, gate, and drain to achieve the high-resistance/low-current state, or a different set of program voltages at the source, gate, and drain to achieve the low-resistance/high-current state. In this regard, FIG. 3 is a circuit diagram of a transistor-based fuse 300 with programming voltages applied that achieve a low-resistance/high-current state, and FIG. 4 is a circuit diagram of a transistor-based fuse 400 with programming voltages applied that achieve a high-resistance/low-current state.

Figure 3:
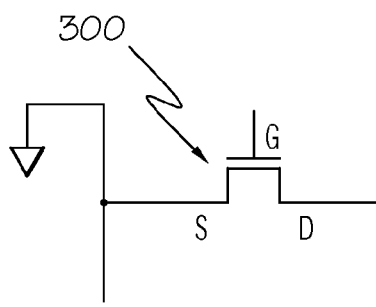
FIG. 3 is a circuit diagram of a transistor-based fuse with programming voltages applied that achieve a low-resistance/high-current state.

Referring to FIG. 3, the source, gate, and drain of fuse 300 are indicated by the letters S, G, and D, respectively. To achieve the low-resistance/high-current state, the source is grounded, the gate is floated (i.e., no voltage is applied or asserted at the gate, and an open circuit condition is created at the gate), and a relatively high programming voltage is applied to the drain. In preferred embodiments, the relatively high programming voltage is a positive voltage that corresponds to a supply voltage of the transistor-based devices with which fuse 300 cooperates. For example, the relatively high programming voltage may be the highest supply voltage (Vdd) available on the chip, as illustrated in FIG. 3.

Figure 4:
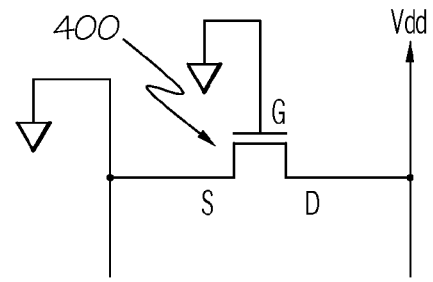
FIG. 4 is a circuit diagram of a transistor-based fuse with programming voltages applied that achieve a high-resistance/low-current state.

Referring to FIG. 4, the source, gate, and drain of fuse 400 are indicated by the letters S, G, and D, respectively. To achieve the high-resistance/low-current state, the source is grounded, the gate is grounded, and a relatively high programming voltage is applied to the drain. Rather than grounding the source and the gate, any relatively low voltage may be applied to both terminals. In preferred embodiments, the relatively high programming voltage is a positive voltage that corresponds to a supply voltage of the transistor-based devices with which fuse 400 cooperates. For example, the relatively high programming voltage may be the highest supply voltage (Vdd) available on the chip, as illustrated in FIG. 4. Notably, the high-resistance/low-current state may be considered to be the default state of a transistor-based fuse. In other words, a transistor-based fuse as described here need not be physically altered or actually "programmed" into the high-resistance/low-current state. In this regard, the voltages depicted in FIG. 4 are utilized in an implementation where all of the drain contacts in the array are coupled together, resulting in a common applied drain voltage. Likewise, a practical array may have all of the source contacts coupled together, resulting in a common applied source voltage (e.g., ground). Thus, the set of program voltages shown in FIG. 4 prevent fuse 400 from being programmed into the low-resistance/high-current state while other fuses in the same array are being so programmed.

Figure 5:
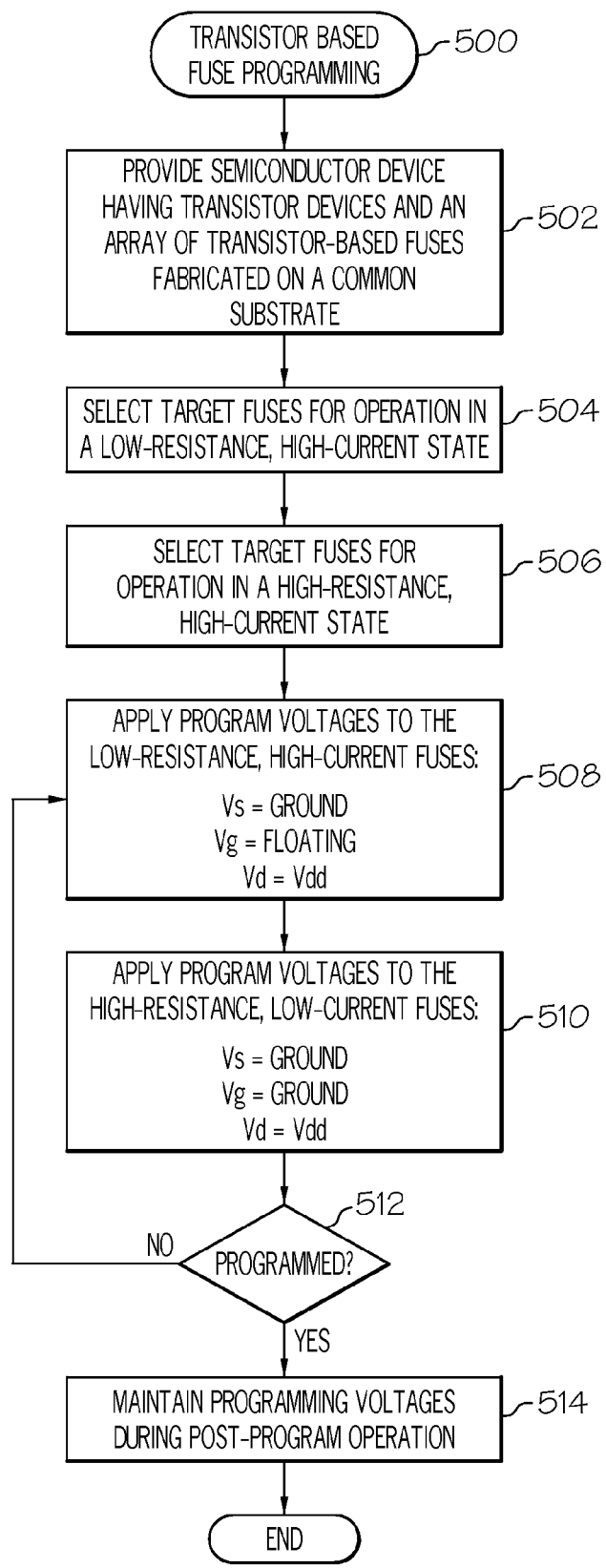
FIG. 5 is a flow chart that illustrates a method of programming a transistor-based fuse array structure.

FIG. 5 is a flow chart that illustrates a method of programming a transistor-based fuse array structure. This transistor-based fuse programming process 500 can be used to program a transistor-based fuse structure or array that is configured as described above. The various tasks performed in connection with process 500 may be performed by software, hardware, firmware, or any combination thereof. For illustrative purposes, the following description of process 500 may refer to elements mentioned above in connection with FIGS. 1-4. It should be appreciated that process 500 may include any number of additional or alternative tasks, the tasks shown in FIG. 5 need not be performed in the illustrated order, and process 500 may be incorporated into a more comprehensive procedure or process having additional functionality not described in detail herein.

Process 500 may begin by providing a suitably configured and fabricated semiconductor device (task 502) that is ready for fuse programming. The semiconductor device will have one or more transistor devices and an array of transistor-based fuses formed on a common semiconductor substrate. As a preliminary step, process 500 selects one or more target fuses (typically, a subset of the fuses in the array) for operation in the low-resistance/high-current state (task 504). This selection may be associated with an automated diagnostic procedure, a human-conducted test, a post-manufacturing test, or the like. In practice, task 504 may identify those target fuses to be programmed by any suitable identifier or locating scheme, such as addresses, column and row identifiers, or the like. As another preliminary step, process 500 may select one or more target fuses (typically, a subset of the fuses in the array) for operation in the high-resistance/low-current state (task 506). The selection itself may be carried out in the manner described above for task 504.

After tasks 504 and 506 have been completed, process 500 continues by establishing or applying appropriate voltages to the transistor-based fuses in the array. A first set of program voltages is applied to the fuses selected during task 504, and a second set of program voltages is applied to the fuses selected during task 506. More particularly, for fuses to be programmed for operation in the low-resistance/high-current state, process 500 grounds the sources, floats the gates, and applies a relatively high programming voltage to the drains (task 508). In certain embodiments, the programming voltage may be within the range of about 0.5 to 2.0 volts. For fuses to be programmed for operation in the high-resistance/low-current state, process 500 grounds the sources, grounds the gates, and applies the programming voltage to the drains (task 510). In certain embodiments, the application of the program voltages can be simplified if all of the sources in the transistor-based fuse array share one common voltage supply connection, and if all of the drains in the transistor-based fuse array share another common voltage supply connection. With such connections, all of the sources can be grounded at the same time, and the same programming voltage can be applied to all of the drains at the same time. Consequently, the two different fuse states can then be set by either grounding or floating the gates in the transistor-based fuse array.

Floating the gate of a transistor-based fuse during the programming stage in this manner achieves the low-resistance/high-current state by causing breakdown of the gate insulator layer. This breakdown represents a failure of the dielectric properties of the gate insulator layer, which enables current to flow from the source region to the gate (through the gate insulator layer), and from the gate to the drain region (through the gate insulator layer). In other words, current can flow freely from the source to the drain, via the gate. Conversely, grounding the gate of a transistor-based fuse during the programming stage prevents breakdown of the gate insulator layer, and preserves the default operation of the transistor. In other words, grounding the gate preserves the gate insulator layer such that current flow from the source to the drain is significantly impeded. Thus, the transistor-based fuse emulates an open circuit when it is maintained in the high-resistance/low-current state.

Programming the transistor-based fuses can be accomplished in milliseconds or less. After the fuses have been programmed (query task 512), process 500 can maintain the program voltages during post-program operation of the associated circuit, system, or devices (task 514). Maintaining the program voltages in this manner may be desirable to ensure that the high-resistance/low-current fuses are not inadvertently biased into the other state.

As explained briefly above, programming a transistor-based fuse into the low-resistance/high-current state results in breakdown of the gate insulator layer and modification of the electrical and physical characteristics of the transistor. The program voltage conditions cause a "positive feedback"

effect in the transistor that ultimately results in the breakdown of the gate insulator layer. In this regard, FIGS. 6-9 are cross sectional views that illustrate the programming of a transistor-based fuse 600.

Figure 6:
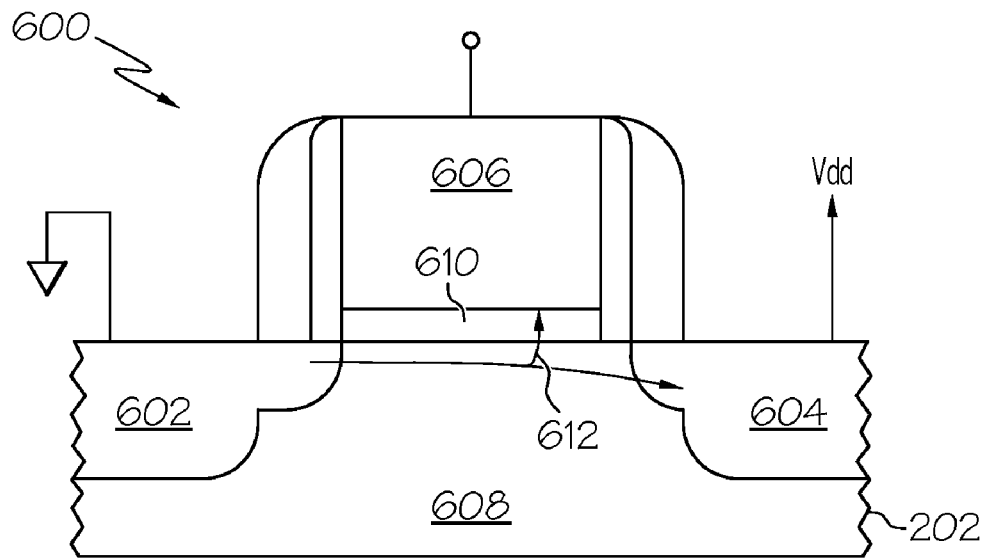
FIGS. 6-9 are cross sectional views that illustrate the programming of a transistor-based fuse.
Figure 7:
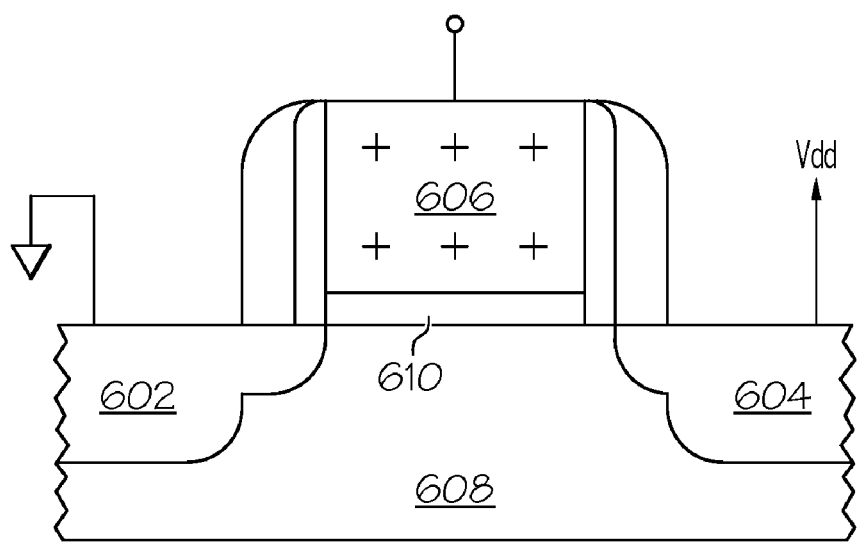

FIG. 6 depicts fuse 600 at the beginning of the program cycle, i.e., after the source 602 has been grounded and Vdd has been applied to the drain 604. Note that the gate 606 remains floating with no external voltage applied or asserted. After these program voltages have been established, hot electrons inject into the gate oxide 610 in the avalanching drain region. In an NFET implementation, the hot carriers are electrons that migrate from the semiconductor material 608 and into the gate oxide 610. In FIG. 6, the small arrow 612 represents the hot electron injection into the gate oxide 610. Electrons will tunnel from the gate oxide 610, which positively charges the gate 606 (as depicted in FIG. 7).

Figure 8:
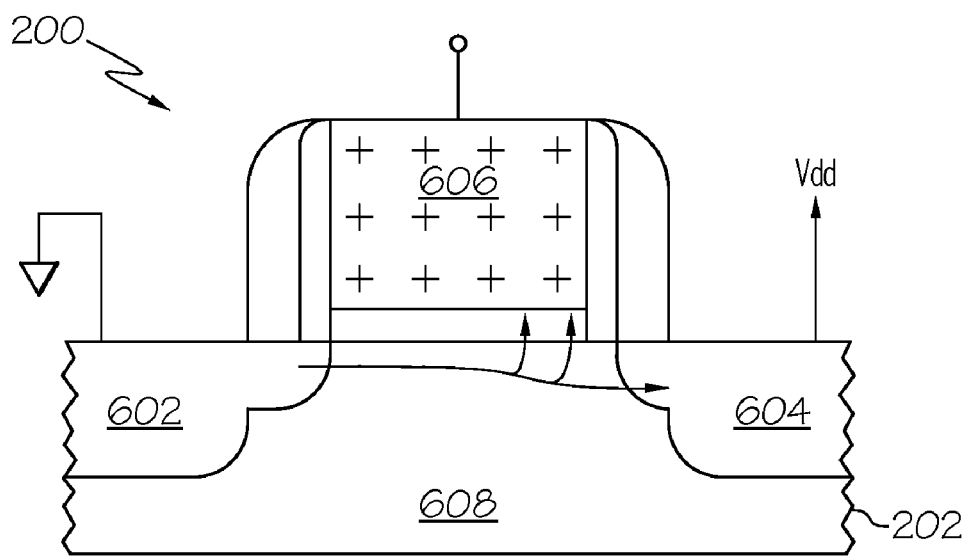
Figure 9:
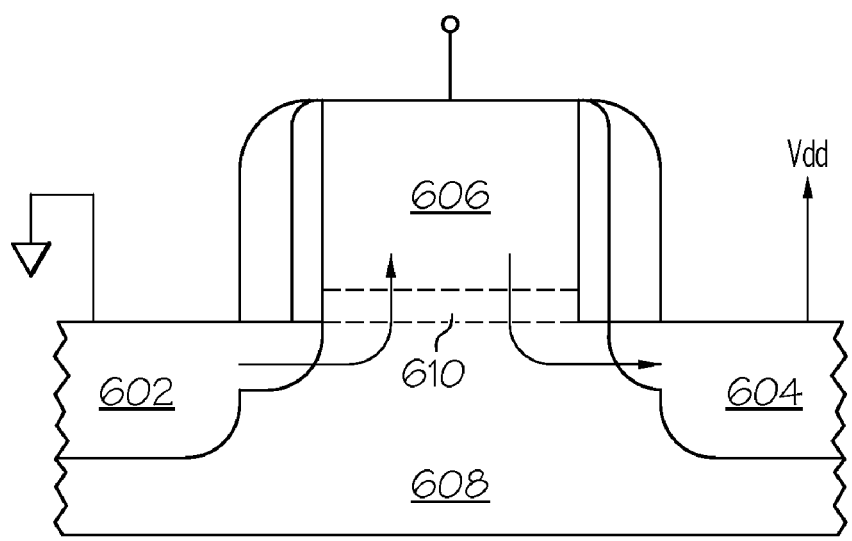

The positive charge on the gate 606 represents a positive bias on the gate 606, which causes the transistor to turn on and establish current flow from the source 602 to the drain 604 (as depicted in FIG. 8). Under these conditions, however, the source-to-drain current increases, which in turn increases the hot carrier injection, which creates a positive feedback effect in the transistor. In other words, hot carrier injection increases and continues to break down the gate insulator layer, which in turn increases the source-to-drain current, and so on. Eventually, the gate insulator layer is "burned" or completely broken down such that its dielectric properties have been lost (or substantially lost). The dashed lines in FIG. 9 represent the broken-down gate oxide 610. At this time, the source 602 and the drain 604 are effectively shorted together, via the gate 606. FIG. 9 depicts the current flow path from the source 602 to the gate 606 (through the broken-down gate oxide 610), and from the gate 606 to the drain 604 (through the broken-down gate oxide 610).

Referring again to FIG. 4, the grounding of the gate during fuse programming prevents the hot carrier injection described with reference to FIGS. 6-9. Consequently, the gate does not become positively charged, the transistor does not get turned on, the feedback effect describe above does not occur, and the gate insulator layer does not break down. Thus, fuse 400 retains its electrical and physical transistor properties, and functions as an open circuit to prevent or substantially impede source-to-drain current flow.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. In a semiconductor device having a semiconductor substrate, transistor devices formed on the semiconductor substrate, and a transistor-based fuse structure formed on the semiconductor substrate, the transistor-based fuse structure comprising a plurality of transistor-based fuses, a method of programming the transistor-based fuse structure comprising:

selecting, from the plurality of transistor-based fuses, a first target fuse to be programmed for operation in a low-resistance/high-current state, the first target fuse having a first source, a first gate, a first drain, and a first gate insulator layer between the first gate and the semiconductor substrate;

selecting, from the plurality of transistor-based fuses, a second target fuse to be programmed for operation in a high-resistance/low-current state, the second target fuse having a second source, a second gate, a second drain, and a second gate insulator layer between the second gate and the semiconductor substrate;

applying a first set of program voltages to the first source, the first gate, and the first drain to cause breakdown of the first gate insulator layer such that current can flow from the first source to the first gate through the first gate insulator layer, and from the first gate to the first drain through the first gate insulator layer; and applying a second set of program voltages to the second source, the second gate, and the second drain of the second target fuse to preserve the second gate insulator layer such that current flow from the second source to the second drain is significantly impeded, wherein applying the second set of program voltages comprises grounding the second source, grounding the second gate, and applying a programming voltage at the second drain.

2. The method of claim 1, wherein applying the first set of program voltages comprises grounding the first source, floating the first gate, and applying a programming voltage at the first drain.

3. The method of claim 2, wherein the programming voltage corresponds to a supply voltage of the transistor devices.

4. The method of claim 1, further comprising maintaining the first set of program voltages on the first target fuse after programming the transistor-based fuse structure.

5. In a semiconductor device having a common semiconductor substrate, transistor devices formed on the common semiconductor substrate and adapted for operation with a supply voltage, and an array of transistor-based fuses formed on the common semiconductor substrate, each of the transistor-based fuses comprising a respective source, drain, gate, and gate insulator layer between the gate and the common semiconductor substrate, a method of programming the array of transistor-based fuses comprising:

applying the same relatively low voltage to the source of each transistor-based fuse in the array;

applying the same relatively high programming voltage to the drain of each transistor-based fuse in the array;

selecting a first subset of transistor-based fuses from the array to be programmed for operation in a low-resistance/high-current state;

selecting a second subset of transistor-based fuses from the array to be programmed for operation in a high-resistance/low-current state;

floating the gate of each transistor-based fuse in the first subset to cause breakdown of the respective gate insulator layers; and grounding the gate of each transistor-based fuse in the second subset to preserve the respective gate insulator layers.

6. The method of claim 5, further comprising:

maintaining the relatively low voltage at the source, floating the gate, and maintaining the relatively high programming voltage at the drain of each transistor-based fuse in the first subset such that relatively high source-to-gate-to-drain current can flow; and maintaining the relatively low voltage at the source, maintaining the relatively low voltage at the gate, and maintaining the relatively high programming voltage at the drain of each transistor-based fuse in the second subset such that source-to-drain current flow is significantly impeded.

7. The method of claim 5, wherein applying the same relatively low voltage comprises grounding the source of each transistor-based fuse in the array.

8. The method of claim 5, wherein applying the same relatively high programming voltage comprises applying the supply voltage of the transistor devices to the drain of each transistor-based fuse in the array.

* * * * *